US009583191B1

(12) United States Patent
Wijnands et al.

(10) Patent No.: US 9,583,191 B1
(45) Date of Patent: Feb. 28, 2017

(54) CAM DESIGN FOR BIT STRING LOOKUP

(71) Applicant: Cisco Technology, Inc., San Jose, CA (US)

(72) Inventors: IJsbrand Wijnands, Leuven (BE); Gregory J. Shepherd, Eugene, OR (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/847,020

(22) Filed: Sep. 8, 2015

(51) Int. Cl.
*G11C 15/04* (2006.01)
*G11C 15/00* (2006.01)

(52) U.S. Cl.
CPC .................................. *G11C 15/00* (2013.01)

(58) Field of Classification Search
USPC ...................................................... 365/49.17
See application file for complete search history.

(56) References Cited

U.S. PATENT DOCUMENTS

| 6,707,694 | B2 | 3/2004 | Regev |
| 6,876,655 | B1 | 4/2005 | Afek et al. |
| 7,035,968 | B1 * | 4/2006 | Pereira ............... G11C 15/00 707/999.006 |
| 7,424,014 | B2 | 9/2008 | Mattes et al. |
| 7,428,160 | B2 | 9/2008 | Kang |
| 7,552,275 | B1 | 6/2009 | Krishnan |
| 7,555,594 | B2 | 6/2009 | Venkatachary |
| 8,395,920 | B2 | 3/2013 | Kim et al. |
| 8,549,208 | B2 | 10/2013 | Lee et al. |
| 2014/0347906 | A1 | 11/2014 | Menut et al. |
| 2015/0032732 | A1 | 1/2015 | Sundstrom |

OTHER PUBLICATIONS

Greg Shepherd, May 2015. Bit Incexed Explicit Replication BIRE. stateless Multi-point Replication.*
Wijnands, Ijsbrand; Multicast Using Bit Index Explicit Replication (Sep. 22, 2014) Can be seen at: https://tools.ietf.org/html/draft-wijnands-bier-architecture-00.

* cited by examiner

*Primary Examiner* — Hoai V Ho
*Assistant Examiner* — Minh Dinh
(74) *Attorney, Agent, or Firm* — Samuel M. Katz

(57) ABSTRACT

In one embodiment, a programming content addressable memory (CAM) comprising at least one match line, the at least one match line being preloaded to high, and being logically OR-ed for all selector lines the at least one match line being inverted to low upon a match result the at least one match line comprising transistors and grounding which are activated only when a stored data value and a corresponding selector line evaluate to 1 and the corresponding selector line having a logical AND with the stored data value, wherein the programming CAM is implemented as a Bit Indexed Explicit Replication (BIER) table. Related apparatus, systems and methods are also described.

20 Claims, 7 Drawing Sheets

CAM DESIGN FOR BIT STRING LOOKUP

FIELD OF THE INVENTION

The present invention generally relates to design of content addressable memory (CAM).

BACKGROUND OF THE INVENTION

Network nodes forward data. Network nodes may take form in one or more routers, one or more bridges, one or more switches, one or more servers, or any other suitable communications processing device. The data is commonly formatted as packets and forwarded using forwarding tables. A packet is a formatted unit of data that typically contains control information and payload data. Control information may include: information that identifies sources and destinations, such as addresses, error detection codes like checksums, sequencing information, etc. Control information is typically found in packet headers and trailers. Payload data is typically located between the packet headers and trailers.

Forwarding packets involves various processes that, while simple in concept, can be complex. The processes involved in forwarding packets vary, depending on the type of forwarding method used. Multicast is the preferred method of data forwarding for many networks. One reason for this is that multicast is a bandwidth-conserving technology that reduces traffic by simultaneously delivering data to multiple receivers. However, some network environments are not well suited to support multicast. Doing so in such environments often involves discovering and maintaining significant amounts of control, or state, information. Setting up and maintaining this control information has a tendency to become complex and costly in terms of computing resources, and can become a major limiting factor in overall network performance. Another issue with multicast is that due to packet delivery mechanisms used, packets are sometimes forwarded to locations where the packets were not desired. This unnecessary delivery of packets represents an unwelcome burden on network performance. Overcoming this burden by traditional means involves generation and maintenance of even more control information.

In conventional IP multicast forwarding, the packets of a given multicast "flow" are forwarded along a tree that has been constructed for the specific purpose of carrying that flow. This requires transit nodes to maintain state on a per-flow basis, and requires the transit nodes to participate in multicast-specific tree building protocols. The flow to which a packet belongs is determined by its IP source and destination address fields.

BIER (Bit Index Explicit Replication) is an alternative method of multicast forwarding. It does not require any multicast-specific trees, and hence does not require any multicast-specific tree building protocols. Within a given "BIER domain", an ingress node encapsulates a multicast data packet in a "BIER header". The BIER header identifies the packet's egress nodes in that domain. Each possible egress node is represented by a single bit within a bitstring; to send a packet to a particular set of egress nodes, the ingress node sets the bits for each of those egress nodes, and clears the other bits in the bitstring. The set bits are be forwarded and replicated at each network node by flooding an IGP (i.e. the interior gateway protocol) in use in the local network with a unique LSA (i.e. a link state advertisement) so that each routing table/RIB (routing information base) in the local network has the bit assignment. Each packet can then be forwarded along the unicast shortest path tree from the ingress node to the egress nodes. Thus there are no per-flow forwarding entries.

BRIEF DESCRIPTION OF THE DRAWINGS

The present invention will be understood and appreciated more fully from the following detailed description, taken in conjunction with the drawings in which.

DESCRIPTION OF EXAMPLE EMBODIMENTS

Overview

An apparatus, system, and method is described, the apparatus, system, and method comprising a programming content addressable memory (CAM) logic comprising at least one match line, the at least one match line being preloaded to high, and being logically OR-ed for all selector lines the at least one match line being inverted to low upon a match result the at least one match line comprising transistors and grounding which are activated only when a stored data value and a corresponding selector line evaluate to 1 and the corresponding selector line having a logical AND with the stored data value, wherein the programming CAM logic is implemented as a Bit Indexed Explicit Replication (BIER) table. Related apparatus, systems and methods are also described.

Exemplary Embodiments

Figure 1:
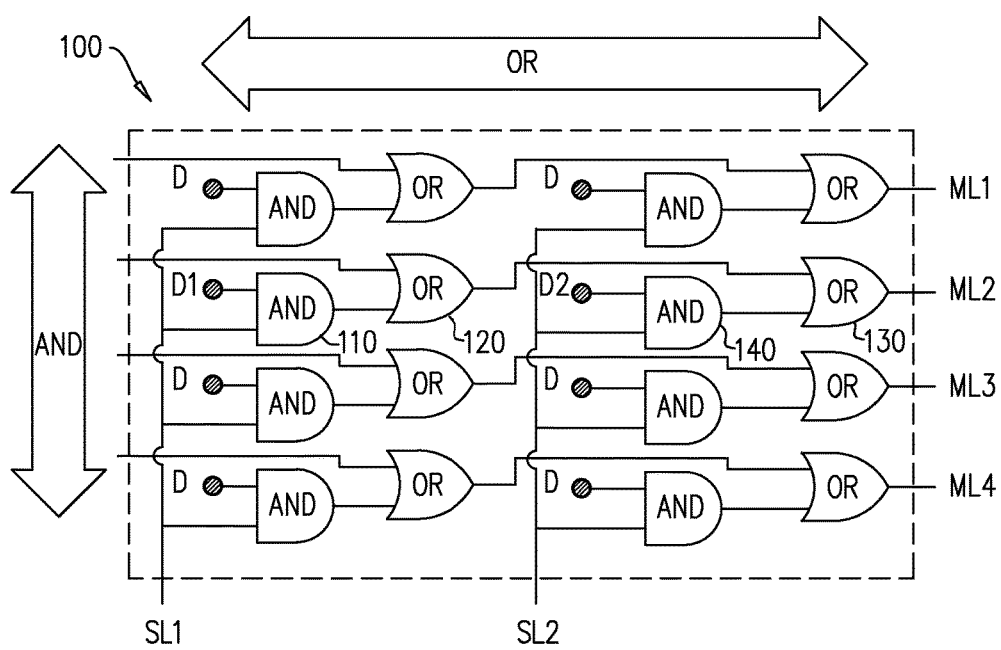
FIG. 1 is a simplified pictorial illustration of a design for a content addressable memory (CAM) optimized for BIER bit string lookup, a B-CAM, constructed and operative in accordance with an embodiment of the present invention.

Reference is now made to FIG. 1, which is a simplified pictorial illustration of a design for a content addressable memory (CAM) optimized for BIER bit string lookup, constructed and operative in accordance with an embodiment of the present invention. For ease of description, the content addressable memory (CAM) optimized for BIER bit string lookup will hereinafter be referred to as B-CAM 100 (i.e., BIER CAM), or, alternatively, B-CAM memory.

D represents data pre-programmed into the B-CAM 100. One exemplary data input, D1 will now be discussed. D1 is input into an AND gate 110, along with an input from a first selector line, SL1. The resulting output from the AND gate is then input into an OR gate 120. The output of the OR gate 120 is input into subsequent OR gates, such as OR gate 130. Additional inputs are input into the OR gate 130, such as an output from a second AND gate 140, which itself receives inputs of data D2 and an input from a selector line SL2. Horizontally across the B-CAM 100, as is seen in FIG. 1, and as just described, all inputs flow eventually into OR gates, as is indicated by the horizontal "OR" arrow on the top of the figure. Vertically in the B-CAM, inputs of selector lines, such as selector lines SL1 and SL2, and of data, such as D1 and D2 are into AND gates, as is indicated by the vertical "AND" arrow on the left side of the figure.

It is appreciated that the use of the terms "vertical" and "horizontal", in all of their grammatical forms, to describe FIG. 1 or other figures to be described below, is a matter of convenience in describing the figure. Physical implementations of logic may vary depending on a variety of factors beyond the scope of the present disclosure.

In BIER systems, the data, such as data D1 and D2 will be inputs from a BIER routing lookup table. Thus, a 1 programmed as data in the BIER routing lookup table will be input into a logical AND with the selector line. As long as the output of one such AND-ing results in a 1 being output, then the subsequent result output on a match line, such as ML2 (for which data D1 and D2, selector lines SL1 and SL2, and gates 110 and 140 all serve as inputs) will be 1. That is to say, that as long as there is a single match outputting a 1 anywhere along the match line ML1, the output value of the match line ML1 will be 1.

By way of contrast, in typical T-CAM architecture, the AND gates of FIG. 1, such as AND gates 110 and 140 are replaced with XNOR gates. Additionally, the OR gates of FIG. 1, such as OR gates 120 and 130 are replaced by AND gates. Thus, in typical T-CAM architecture, outputs are AND-ed horizontally across a T-CAM circuit. Inputs are XNOR-ed vertically through the T-CAM circuit. Accordingly, match lines will only yield a match on input pair of 0/0 or 1/1. Thus, unless there are "don't care" (d) values in the match line, as may be the case with T-CAM memory systems, there must be 1s consistently horizontally across the T-CAM in order to yield a match.

Figures 2, 3:
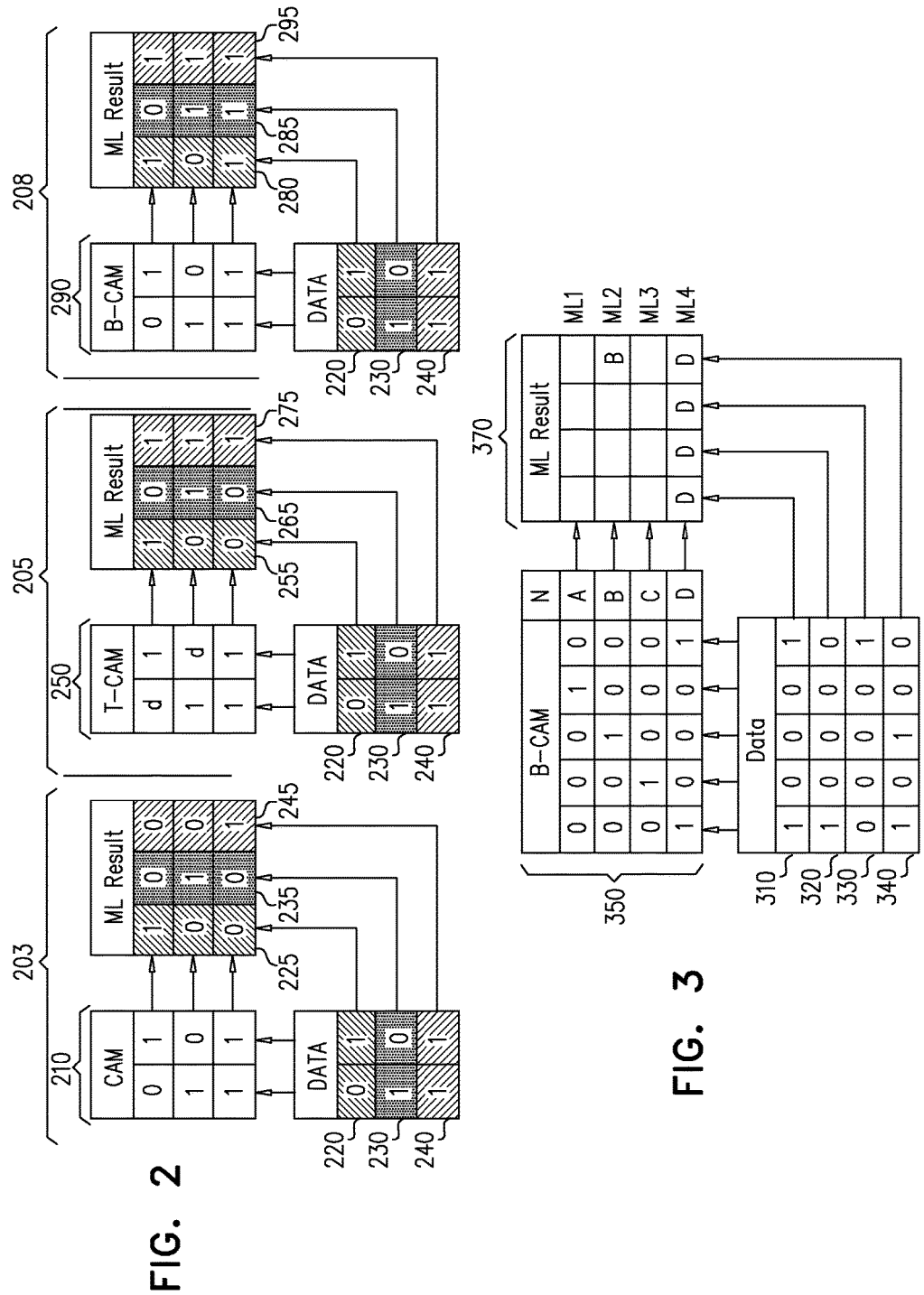
FIG. 2 is a depiction of differing behaviors of different types of CAMs, including the B-CAM of FIG. 1.
FIG. 3 is a depiction of the behavior of the B-CAM of FIG. 1 when various data is applied thereto.

Reference is now made to FIG. 2, which is a depiction of differing behaviors of different types of CAMs, including the B-CAM of FIG. 1. FIG. 2 depicts a comparison of a CAM memory system 203, a T-CAM memory system 205, and a B-CAM memory system 208, such as the B-CAM 100 of FIG. 1. The three rows of CAM table 210, T-CAM table 250, and B-CAM table 290 are populated with similar values. There are three rows in each of the CAM table 210, T-CAM table 250, and B-CAM table 290. The CAM table 210 and B-CAM table 290 are populated as follows: <0,1>; <1,0>; and <1,1>. In the case of T-CAM memory system 205, the three rows are populated with a d (i.e. don't care), instead of with 0s—i.e.: <d,1>; <1,d>; and <1,1>. The CAM and T-CAM programming of the bits is brought here in order to demonstrate that in existing systems the desired result, which can be directly obtained using the B-CAM, is not obtainable. As such, while other indirect methods must be implemented in systems comprising CAM and T-CAM memory systems, using B-CAM memory, the desired result for BIER bit string lookup and match line result is directly obtainable.

In the case of the CAM memory system 203, the first row of data 220, <0,1> is XNOR-ed with the columns populating the CAM table 210: <0,1,1> and <1,0,1>. The result 225 of inputting the first row of data 220 into the CAM table 210 is: <1,0,0>. This result is produced as explained below. The 0 of the first row of data 220 is XNOR-ed with the first 0 of the left column of the CAM table 210:
 0 XNOR 0=1.

The 1 of the first row of data 220 is XNOR-ed with the first 1 of the right column of the CAM table 210:
 1 XNOR 1=1
The two results are then AND-ed together:
 1 AND 1=1
Thus, the first result in the CAM 203 match line (ML) column 225 for the data row 220 is 1.

Similarly, the 0 of the first row of data 220 is XNOR-ed with the middle 1 of the left column of the CAM table 210:
 0 XNOR 1=0.
The 1 of the first row of data 220 is XNOR-ed with the middle 0 of the right column of the CAM table 210:
 1 XNOR 0=0
The two results are then AND-ed together:
 0 AND 0=0
Finally, the 0 of the first row of data 220 is XNOR-ed with the final 1 of the left column of the CAM table 210:
 0 XNOR 1=0.
The 1 of the first row of data 220 is XNOR-ed with the final 1 of the right column of the CAM table 210:
 1 XNOR 1=1
The two results are then AND-ed together:
 0 AND 1=0
Thus, the results of applying the first row 220 of the data table in the CAM memory system 203 gives column 225, i.e. <1,0,0>.

The results of data row 230, i.e. match line result column 235 for data row 230: <0,1,0> may be derived in a similar fashion to the derivation of match line result column 225 above.

The final column of the results for the CAM memory system 203 with the data line 240 <1,1> which produces the match line result column 245 for data row 240: <0,0,1> may be derived as follows:

The first 1 of the last row of data 240 is XNOR-ed with the first 0 of the left column of the CAM table 210:
 1 XNOR 0=0.
The second 1 of the first row of data 240 is XNOR-ed with the first 1 of the right column of the CAM table 210:
 1 XNOR 1=1
The two results are then AND-ed together:
 0 AND 1=0
Thus, the first result in the CAM memory system 203 match line result column 245 for the data row 220 is 0.

Similarly, the first 1 of the last row of data 240 is XNOR-ed with the middle 1 of the left column of the CAM table 210:
 1 XNOR 1=1.
The second 1 of the last row of data 240 is XNOR-ed with the middle 0 of the right column of the CAM table 210:
 1 XNOR 0=0
The two results are then AND-ed together:
 1 AND 0=0
Finally, the first 1 of the last row of data 240 is XNOR-ed with the final 1 of the left column of the CAM table 210:
 1 XNOR 1=1.
The second 1 of the last row of data 240 is XNOR-ed with the final 1 of the right column of the CAM table 210:
 1 XNOR 1=1
The two results are then AND-ed together:
 1 AND 1=1
Thus, the results of applying the last row 240 of the data table in the CAM 203 system gives column 245, i.e. <0,0,1>.

Turning now to the T-CAM memory system 205, as was mentioned above, instead of 0s, a "do not care" state (d) is implemented. That is to say that either a 0 or a 1 will produce a match with a "d"—always yielding a result of TRUE.

Thus, the result 255 of inputting the first row of data 220 into the T-CAM table 250 is: <1,0,0>. This result is produced as explained below. The 0 of the first row of data 220 is XNOR-ed with the first d of the left column of the CAM table 210:

d XNOR 0=1.

The 1 of the first row of data 220 is XNOR-ed with the first 1 of the right column of the T-CAM table 250:

1 XNOR 1=1

The two results are then AND-ed together:

1 AND 1=1

Similarly, the 0 of the first row of data 220 is XNOR-ed with the middle 1 of the left column of the T-CAM table 250:

0 XNOR 1=0.

The 1 of the first row of data 220 is XNOR-ed with the middle d of the right column of the T-CAM table 250:

1 XNOR d=1

The two results are then AND-ed together:

0 AND 1=0

Finally, the 0 of the first row of data 220 is XNOR-ed with the final 1 of the left column of the T-CAM table 250:

0 XNOR 1=0.

The 1 of the first row of data 220 is XNOR-ed with the final 1 of the right column of the T-CAM table 250:

1 XNOR 1=1

The two results are then AND-ed together:

0 AND 1=0

Thus, the results of applying the first row 220 of the data table in the T-CAM memory system 205 gives match line result column 255, i.e. <1,0,0>.

The results of data rows 230 and 240, i.e. match line result column 265 for data row 230: <0,1,0>; and match line result column 275 for data row 240: <1,1,1> may be derived in a similar fashion to the derivation of match line result column 255 above.

In the B-CAM memory system 208, however, instead of XNOR and AND gates, as was noted above, with reference to FIG. 1, there are, respectively, AND and OR gates. It is appreciated that in an actual system comprising the B-CAM memory system 208 in which BIER multicast forwarding is implemented, the rows of data in the B-CAM table 290 are forwarding table entries referring to network neighbors. Data rows 220, 230 and 240 are bit masks from headers of incoming packets.

Thus, the first row of data 220, <0,1> is input to the columns populating the B-CAM table 290: <0,1,1> and <1,0,1>.

The result 280 of inputting the first row of data 220 (i.e. a first bitmask from a first incoming packet) into the B-CAM table 290 is: <1,0,1>. This result is produced as explained below. The 0 of the first row of data 220 is AND-ed with the first 0 of the left column of the B-CAM table 290 (i.e. a first forwarding table entry referring to a first neighboring network device):

0 AND 0=0.

The 1 of the first row of data 220 is AND-ed with the first 1 of the right column of the B-CAM table 290:

1 AND 1=1

The two results are then OR-ed together:

0 OR 1=1

Thus, the first result in the B-CAM memory system 208 match line result column 280 for the data row 220 is 1.

Similarly, the 0 of the first row of data 220 is AND-ed with the middle 1 of the left column of the B-CAM table 290:

0 AND 1=0.

The 1 of the first row of data 220 is AND-ed with the middle 0 of the right column of the B-CAM table 290:

1 AND 0=0

The two results are then OR-ed together:

0 OR 0=0

Finally, the 0 of the first row of data 220 is AND-ed with the final 1 of the left column of the B-CAM table 290:

0 AND 1=0.

The 1 of the first row of data 220 is AND-ed with the final 1 of the right column of the B-CAM table 290:

1 AND 1=1

The two results are then OR-ed together:

0 OR 1=1

Thus, the results of applying the first row 220 of the data table in the B-CAM memory system 208 gives column 280, i.e. <1,0,1>.

Similarly, the second row of data 230, <1,0> is input to the columns populating the B-CAM table 290: <0,1,1> and <1,0,1>.

The result 285 of inputting the second row of data 230 (i.e. a second bitmask from a second incoming packet) into the B-CAM table 290 is: <0,1,1>. This result is produced as explained below. The 1 of the second row of data 230 is AND-ed with the first 0 of the left column of the B-CAM table 290 (i.e. a first forwarding table entry referring to a first neighboring network device):

1 AND 0=0.

The 0 of the second row of data 230 is AND-ed with the first 1 of the right column of the B-CAM table 290:

0 AND 1=0

The two results are then OR-ed together:

0 OR 0=0

Thus, the first result in the B-CAM memory system 208 match line (ML) column 285 for the data row 220 is 0.

Similarly, the 1 of the second row of data 230 is AND-ed with the middle 1 of the left column of the B-CAM table 290:

1 AND 1=1.

The 0 of the second row of data 230 is AND-ed with the middle 0 of the right column of the B-CAM table 290:

0 AND 0=0

The two results are then OR-ed together:

1 OR 0=1

Finally, the 1 of the second row of data 230 is AND-ed with the final 1 of the left column of the B-CAM table 290:

1 AND 1=1.

The 1 of the second row of data 230 is AND-ed with the final 1 of the right column of the B-CAM table 290:

1 AND 1=1

The two results are then OR-ed together:

1 OR 1=1

Thus, the results of applying the second row of data 230 of the data table in the B-CAM memory system 208 gives column 285, i.e. <0,1,1>.

Likewise, the third row of data 240, <1,1> (i.e. a third bitmask from a third incoming packet) is input to the columns populating the B-CAM table 290: <0,1,1> and <1,0,1> (i.e. forwarding table entries referring to a neighboring network devices).

The result 295 of inputting the third row of data 240 into the B-CAM table 290 is: <1,1,1>. This result is produced as follows. The first 1 of the third row of data 240 is AND-ed with the first 0 of the left column of the B-CAM table 290:

1 AND 0=0.

The second 1 of the third row of data 240 is AND-ed with the first 1 of the right column of the B-CAM table 290:

1 AND 1=1

The two results are then OR-ed together:

=1

Thus, the first result in the B-CAM memory system 208 match line column 295 for the data row 240 is 1.

Similarly, the first 1 of the third row of data 240 is AND-ed with the middle 1 of the left column of the B-CAM table 290:

1 AND 1=1.

The second 1 of the third row of data 240 is AND-ed with the middle 0 of the right column of the B-CAM table 290:

1 AND 0=0.

The two results are then OR-ed together:

1 OR 0=1.

Finally, the first 1 of the third row of data 240 is AND-ed with the final 1 of the left column of the B-CAM table 290:

1 AND 1=1.

The second 1 of the third row of data 240 is AND-ed with the final 1 of the right column of the B-CAM table 290:

1 AND 1=1

The two results are then OR-ed together:

1 OR 1=1.

Thus, the results of applying the third row of data 240 of the data table in the B-CAM memory system 208 gives column 295, i.e. <1,1,1>.

Reference is now made to FIG. 3, which is a depiction of the behavior of the B-CAM 100 of FIG. 1 when various data is applied thereto. Various data strings 310, 320, 330, and 340 of FIG. 3 are shown as inputs to a B-CAM table 350. The various data strings 310, 320, 330, and 340, as explained above with reference to FIG. 2, are various bitmasks which come from incoming packet headers. The B-CAM table 350 may be an implementation of a routing table which indicates to which of four neighbors a packet is to be routed. That is to say that the B-CAM table 350 is populated with forwarding table entries (such as entries in a routing information base (RIB) table) referring to various network neighbors of a device comprising the B-CAM 100 of FIG. 1. Data which matches any of the rows of the B-CAM table 350 is considered to match, and, accordingly, a packet which provided the matching data is therefore forwarded to the neighbor indicated in column N (i.e. Neighbor) of the B-CAM table 350, for that row. Since all of the other values in the data row 310 are zeros, and they are AND-ed with zeros in the B-CAM table 350, the OR-ing of the results yields a final result which, as already mentioned, is a match for neighbor D.

Data row 310, <1,0,0,0,1> (i.e. a bitmask from an incoming packet) is input into the B-CAM table 350. As explained in the description of FIG. 2, the bits of the data row 310 are AND-ed with the data in the rows of the B-CAM table 350 (i.e. forwarding table entries). Thus, the leftmost 1 of data row 310 matches the first 1 in the final row of B-CAM table 350. Accordingly, data row 310 indicates a match in the match line results table 370 of neighbor D. Since all of the other values in the data row 320 are zeros, and they are AND-ed with zeros in the B-CAM table 350, the OR-ing of the resulting 1 with the resulting 0s yields a final result which, as already mentioned, is a match for neighbor D.

It is appreciated that because the first operation which is executed on the bits is AND-ing the bits, a match will result only when both of the bits are 1s. Since across the match lines only OR operations occur, a single 1 will produce a match.

Data row 320, <1,0,0,0,0> (i.e. a bitmask from an incoming packet) is input into the B-CAM table 350. The leftmost bit in data row 320 matches the first 1 in the final row of B-CAM table 350 (i.e. forwarding table entries). Accordingly, data row 320 indicates a match in the match line results table 370 of neighbor D. Since all of the other values in the data row 320 are zeros, and they are AND-ed with zeros in the B-CAM table 350, the OR-ing of the results yields a final result which, as already mentioned, is a match for neighbor D.

Data row 330, <0,0,0,0,1> (i.e. a bitmask from an incoming packet) is input into the B-CAM table 350. The rightmost bit in data row 330 matches the final 1 in the final row of B-CAM table 350 (i.e. forwarding table entries). Accordingly, data row 330 indicates a match in the match line results table 370 of neighbor D. Since all of the other values in the data row 330 are zeros, and they are AND-ed with zeros in the B-CAM table 350, the OR-ing of the results yields a final result which, as already mentioned, is a match for neighbor D.

Data row 340, <1,0,1,0,0> (i.e. a bitmask from an incoming packet) is input into the B-CAM table 350. The leftmost bit in data row 340 matches the first 1 in the final row of B-CAM table 350 (i.e. forwarding table entries). The third bit, also a 1, matches the 1 bit of the second row of B-CAM table 350. Accordingly, data row 340 indicates a match in the match line results table 370 of neighbors B and D. Since all of the other values in the data row 340 are zeros, and they are AND-ed with zeros in the B-CAM table 350, the OR-ing of the results yields a final result which, as already mentioned, is a match for neighbors B and D.

The above example shows how the B-CAM 100 may be used for routing tables, by using the match lines to route packets to appropriate neighbors.

Figure 4:
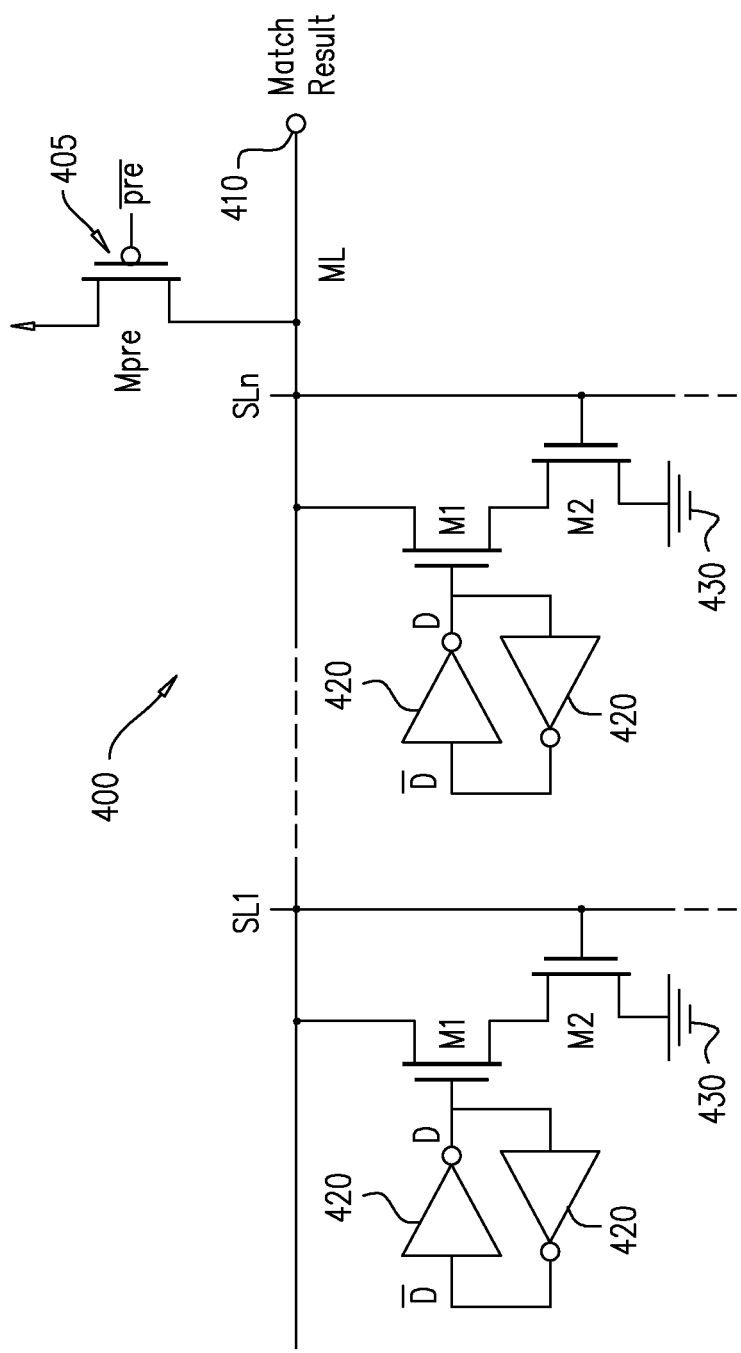
FIG. 4 is a depiction of an implementation of the B-CAM of FIG. 1.

Reference is now made to FIG. 4, which is a depiction of an implementation 400 of a B-CAM 100 of FIG. 1. Match line ML is preloaded high by a mechanism activated by a transistor 405. Accordingly, when an inverter 410 is applied, the pre-load high becomes low.

D indicated in FIG. 4 corresponds to the data, D, pre-programmed into the B-CAM 100, as discussed above in the discussion of FIG. 1. M1 and M2 are a pair of transistors connected to grounds 430. An input to M1, i.e. the value of D, is stored in any appropriate memory cell, including, but not limited to a Dynamic Random Access Memory cell (DRAM), a Static Random Access Memory cell (SRAM), and flip flops. The structure of the memory cell need not be limited to the depiction as it appears in FIG. 4. If D is equal to 1, and selector line SL1 is equal to 1, then ML1 is now pulled down (from being preloaded high) since it is now connected to ground 430. Thus ML1 is now set low. Accordingly, if ML1 is set low, when an inverter 410 is applied, then ML1 becomes set high once again. Therefore, a match between one of the selector lines, such a selector line SL1 and the ML yields an end result of 1

It is appreciated that for all other values of either D, SL, or SLn, ML is not connected to ground 430, and will yield and end result of 0.

Each bit is tested against input along each of the different selector lines (for instance SLn, as opposed to SL1), and as such a different pre-programmed value of D is input (i.e. there is one preprogrammed value of D per selector line). If any of the selector lines are set to 1, ML will be set low and subsequently be inverted by inverter 410 back to high. Conversely, if none of the selector lines are set to 1, ML will remain high (as it was pre-loaded) and subsequently be inverted by inverter 410 to low.

Figure 5:
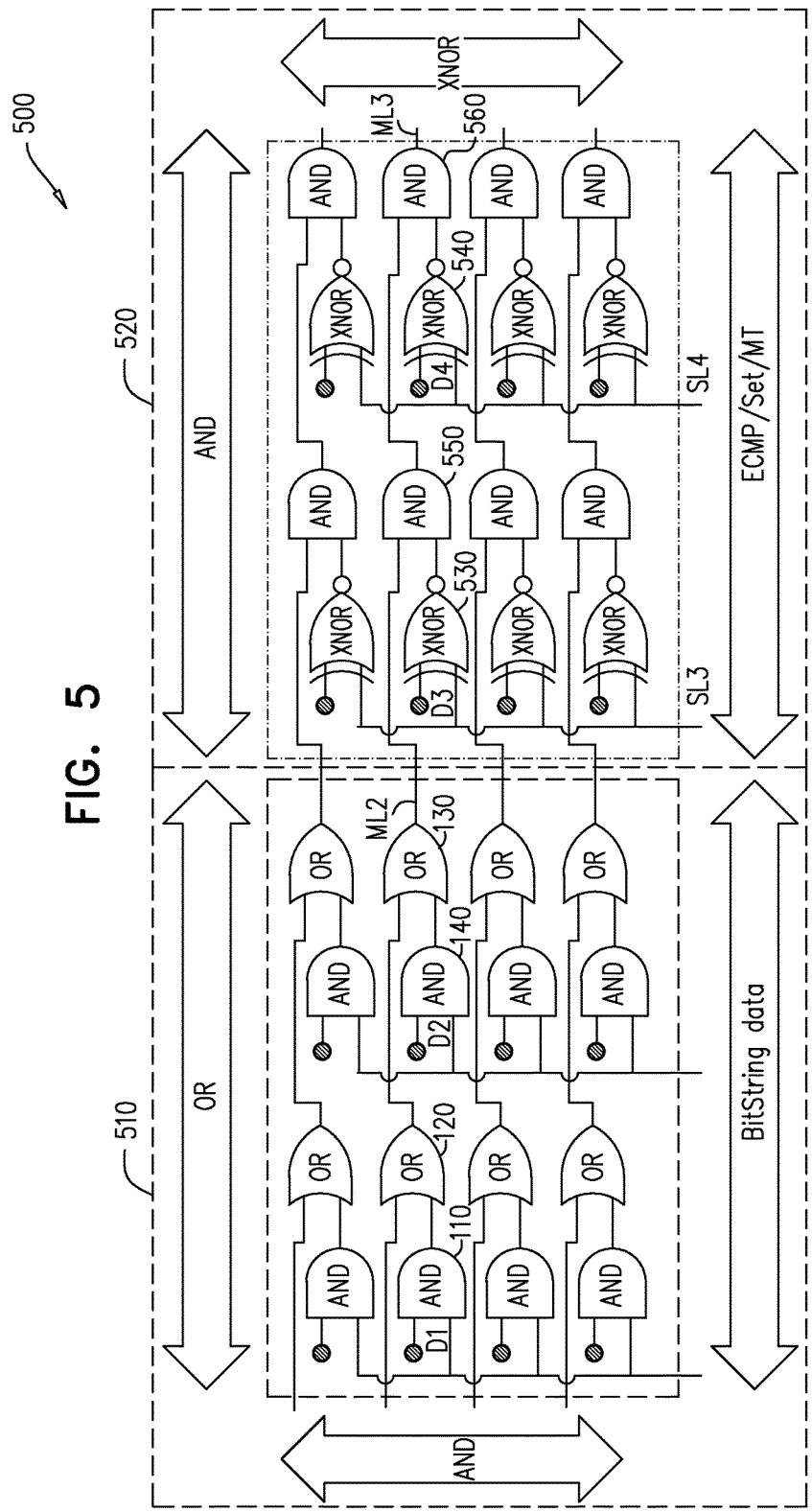
FIG. 5 is a depiction of logic circuitry for implementing a method of partitioning a physical CAM into multiple tables, the physical CAM incorporating the B-CAM of FIG. 1.

Reference is now made to FIG. 5, which is a depiction of logic circuitry for implementing a method of partitioning a physical CAM 500 into multiple tables, the physical CAM 500 incorporating the B-CAM 100 of FIG. 1. BIER forwarding requires multiple tables. FIG. 5 illustrates how multiple tables can be implemented by connecting a B-CAM 510 with a T-CAM 520. The B-CAM 510 is described above, with reference to corresponding B-CAM 100 of FIG. 1.

As was mentioned above in the discussion of FIG. 1, by way of contrast, in typical T-CAM architecture, such as in T-CAM 520, the AND gates of the B-CAM 510, such as AND gates 110 and 140 are replaced with XNOR gates, such as XNOR gates 530 and 540. Additionally, the OR gates of B-CAM 510, such as OR gates 120 and 130 are replaced by AND gates, such as AND gates 550 and 560. Thus, in typical T-CAM 520 architecture, outputs are AND-ed horizontally across a T-CAM 520 circuit. Inputs are XNOR-ed vertically through the T-CAM 520 circuit. Accordingly, match lines will only yield a match on input pair of 0/0 or 1/1. Thus, unless there are "don't care" (d) values in the match line, there must be 1s consistently horizontally across the T-CAM 520 to produce a match.

Accordingly, in the T-CAM 520, if both selector lines in an ECMP (Equal-Cost Multi-Path routing) routing table, such as SL3 and SL4, are set to 1, and the pre-programmed data is also set to 1, then, a lookup in a BIER table will be effective on the match line, such as ML3. That is to say, if a 1 is output, as explained above, from the B-CAM 510 on ML2 into the T-CAM 520, the 1 will be AND-ed at gate 550 with the output of XNOR gate 530. XNOR gate 530 produces its output based on pre-programmed data D3 and an input from selector line SL3.

Those of skill in the art will appreciate that ECMP routing is a routing strategy where next-hop packet forwarding to a single destination can occur over multiple "best paths" which vie for top place in routing metric calculations. As such, traffic is distributed across multiple high-bandwidth links to increase networking performance.

The output of AND gate 550 is input into AND gate 560 and then AND-ed with an output from XNOR gate 540, which produces its output in a manner similar to XNOR gate 530, taking pre-programmed data D4 and a value from selector line SL4 as its inputs.

As such, only if the outputs of AND gates 550 and 560 are themselves both 1 will ML3 output a 1. That is to say, the result of a lookup in the BIER lookup table implemented in B-CAM 510 will have an effect (i.e. when ML3 outputs 1) in the T-CAM 520. Accordingly, T-CAM 520 can be programmed to select which B-CAM 510 outputs to consider. The physical CAM comprising the circuit of FIG. 5 may therefore be partitioned into multiple Bit Indexed Explicit Replication (BIER) tables, as explained below.

Figure 6:
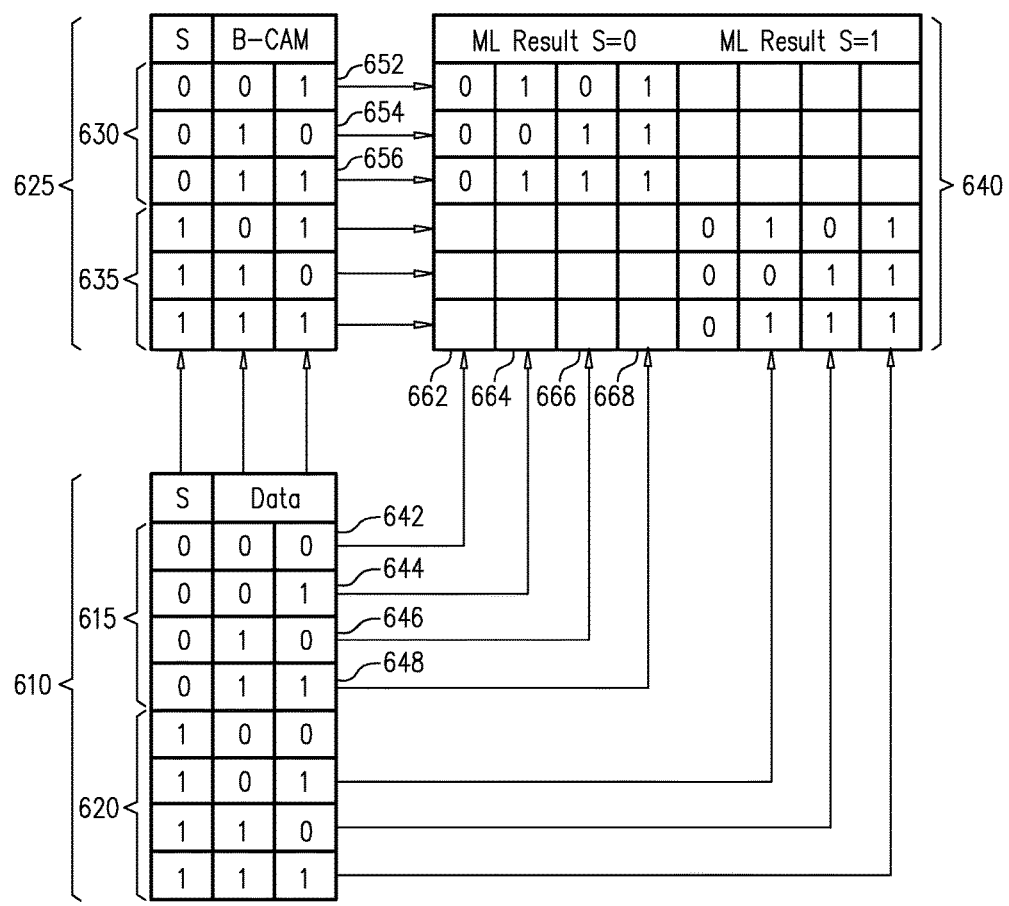
FIG. 6 depicts how exemplary B-CAM cells can be used as selector line for bit stream look up.

Reference is now made to FIG. 6, which depicts how exemplary B-CAM cells can be used as selector lines for bit stream look up. Based on the above discussion of FIG. 5, FIG. 6 shows how, by populating the T-CAM 520 so that desired data and selector lines are pre-programmed with is, match lines from the B-CAM 510 which output is can be made to output is from the T-CAM 520. Alternatively, by pre-populating the T-CAM 520 appropriately, match lines from the B-CAM 510 (i.e. forwarding table entries referring to various network neighbors) which output 1s can be made to output is from the T-CAM 520.

Data table 610 is shown in one portion 615 subdivided for selector line 0 and a second portion 620 subdivided for selector line 1, as indicated by S column 615 and 620. As noted above (see, for example, the description of FIG. 3) the data in data table 610 represents bit masks from various incoming multicast packets. Similarly, B-CAM table 625 is shown in one portion 630 subdivided for selector line 0 and a second portion 635 subdivided for selector line 1. Since the data in portion 615 (for selector line 0) of data table 610 is the same as the data in portion 620 (for selector line 1) of data table 610, the following discussion of the determination of the results 640 focuses only on the data in portion 615 (for selector line 0) of data table 610.

The first data line, data line 642 <0,0> is applied to B-CAM line 652 <0,1>. Thus:
 0 AND 0=0; and
 AND 1=0
These two results are then OR-ed:
 0 OR 0=0
The output, 0 from the B-CAM 510 (referring back to FIG. 5, for this explanation) is then input into the T-CAM 520. In order to ensure that the output for B-CAM match line is not entirely negated, the T-CAM 520 is populated so that the X-NOR gate, such as X-NOR gate 530 is 1, which is then AND-ed, for instance, by AND gate 550, with the output of the B-CAM match line (note that this is true for all of the following steps). Thus:
 0 AND 1=0.
The first data line, data line 642 <0,0> is also applied to B-CAM line 654 <1,0>. Thus:
 0 AND 1=0; and
 0 AND 0=0
These two results are then OR-ed:
 0 OR 0=0
The output, 0 from the B-CAM 510 is then input into the T-CAM 520. Thus:
 0 AND 1=0.
The first data line, data line 642 <0,0> is further applied to B-CAM line 656 <1,1>. Thus:
 0 AND 1=0; and
 0 AND 1=0
These two results are then OR-ed:
 0 OR 0=0
The output, 0 from the B-CAM 510 is then input into the T-CAM 520. Thus:
 0 AND 1=0.
The above discussion illustrates how match line result for portion 615 of the data and portion 630 of the B-CAM (i.e. subdivided for selector line 0) results in match line result column 662: <0,0,0>.

Similar computation for data line 644 with B-CAM lines 652, 654, and 656 results in match line result column 664: <1,0,1>. Likewise, similar computation for data line 646 with B-CAM lines 652, 654, and 656 results in match line result column 666: <0,1,1>. Computation for data line 648 with B-CAM lines 652, 654, and 656 results in match line result column 668: <1,1,1>.

Figure 7:
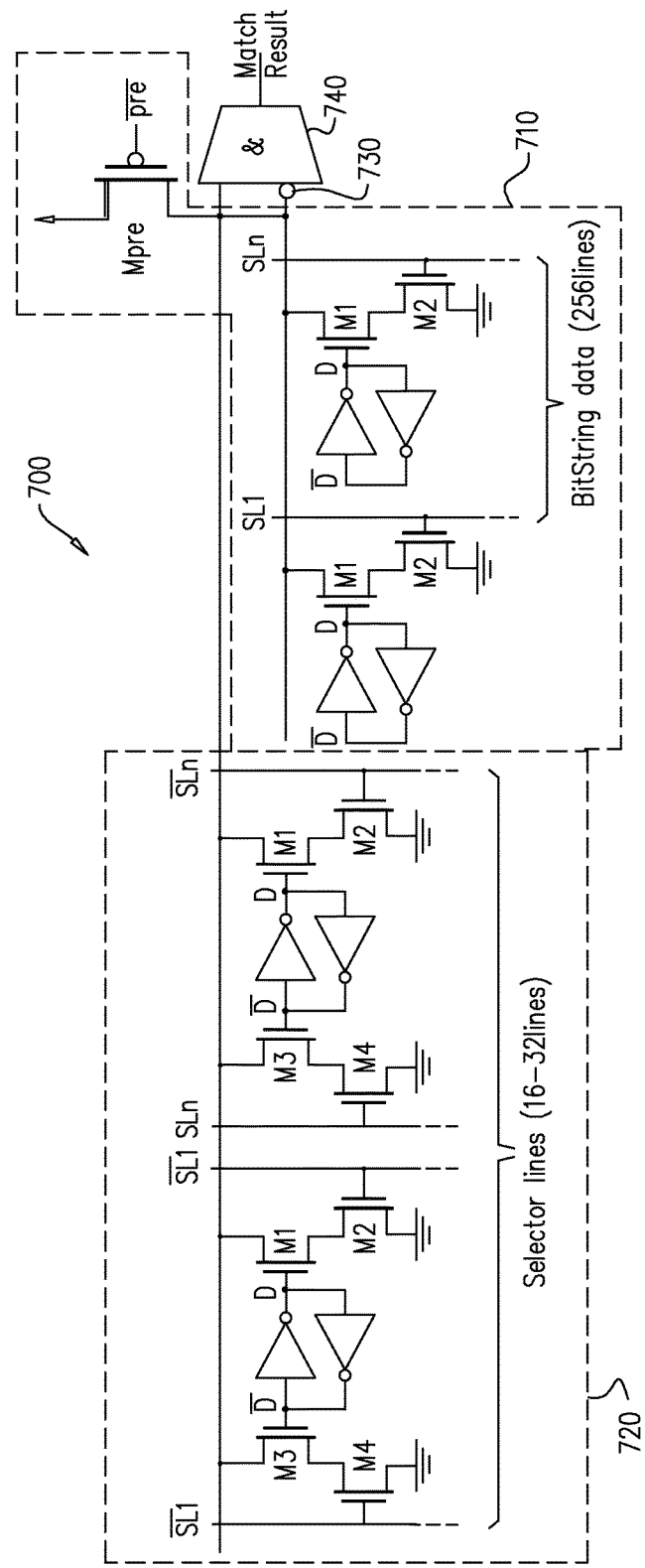
FIG. 7 depiction of an implementation of the physical CAM of FIG. 5.

Reference is now made to FIG. 7, which is a depiction of an implementation of the physical CAM 700 of FIG. 5. The B-CAM section 710 of the CAM 700 has already been described above with reference to FIG. 4. As indicated in FIG. 7, the B-CAM section 710 may be implemented so that up to 256 lines of Bit String (i.e. BIER) data may appear.

The T-CAM 720, as is indicated in the figure, may support from 16-32 selector lines. The physical implementation of T-CAM 720 is well known in the art, and as such, is not described herein.

A low result from the B-CAM 710 result is inverted by inverter 730, turning the B-CAM 710 result high. Accordingly, a match line result which is high for the T-CAM 720 and an input which the high output of inverter 730 are then input into AND function 740. The result would indicate a match, i.e. remain high.

Figure 8:
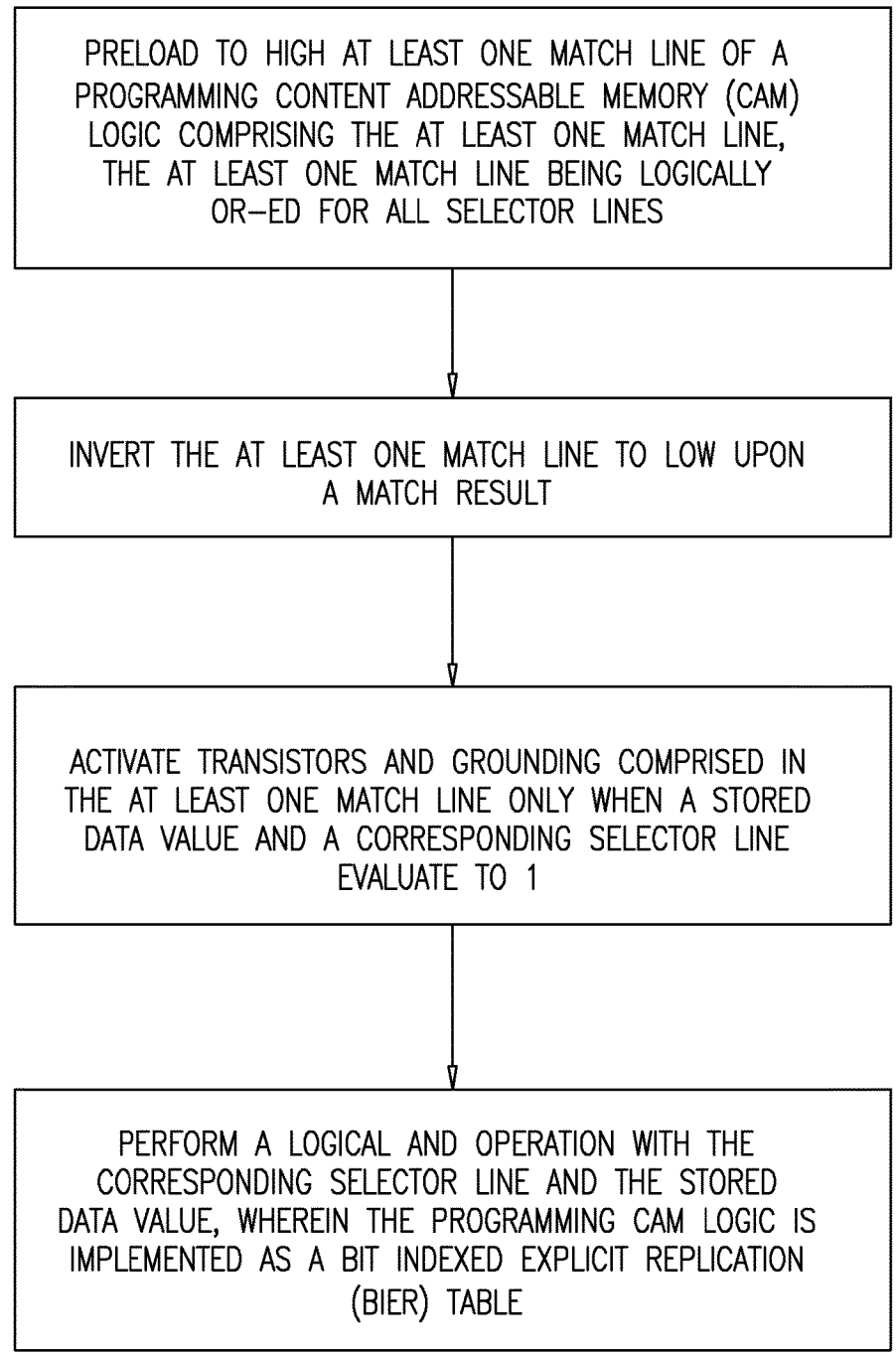
FIG. 8 is a simplified flow chart of a method of implementing the apparatus of FIG. 1.

Reference is now made to FIG. 8, which is a simplified flow chart of a method of implementing the apparatus of FIG. 1. The method of FIG. 8 is believed to be self-explanatory with reference to the above discussion.

It is appreciated that software components of the present invention may, if desired, be implemented in ROM (read only memory) form. The software components may, generally, be implemented in hardware, if desired, using conventional techniques. It is further appreciated that the software components may be instantiated, for example: as a computer program product or on a tangible medium. In some cases, it may be possible to instantiate the software components as a signal interpretable by an appropriate computer, although such an instantiation may be excluded in certain embodiments of the present invention.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited by what has been particularly shown and described hereinabove. Rather the scope of the invention is defined by the appended claims and equivalents thereof:

What is claimed is:

1. An apparatus comprising:
   a programming content addressable memory (CAM) comprising at least one match line, the at least one match line being preloaded to high, and being logically OR-ed for all selector lines;
   the at least one match line being inverted to low upon a match result;
   the at least one match line comprising a memory cell which is activated only when a stored data value and a corresponding selector line evaluate to 1; and
   the corresponding selector line having a logical AND with the stored data value.

2. The apparatus according to claim 1 wherein the programming CAM is implemented as a Bit Indexed Explicit Replication (BIER) table.

3. The apparatus according to claim 2 wherein data populating the BIER table comprises forwarding entries of a routing information base (RIB).

4. The apparatus according to claim 1 wherein input data to the CAM comprises a bit mask in a header of an incoming packet.

5. The apparatus according to claim 1, wherein the apparatus is partitioned into multiple BIER tables by connecting the CAM with a ternary CAM (T-CAM).

6. The apparatus according to claim 5 wherein a bit mask is programmed in a packet in order to implement a match line for each neighbor.

7. The apparatus according to claim 2 wherein the BIER table corresponds to a routing information base (RIB).

8. The apparatus according to claim 1 wherein logic implemented by the CAM comprises:
   a plurality of AND gates, each AND gate of the plurality of AND gates having a first input comprising data pre-programmed into the CAM;
   a second input comprising an input from a selector line; and
   an output into an OR gate.

9. The apparatus according to claim 1 wherein logic implemented by the CAM comprises:
   a plurality of OR gates, each OR gate of the plurality of OR gates having a first input comprising an output of an AND gate; and
   a second input from a second OR gate.

10. The apparatus according to claim 1 wherein data inputs to the programming CAM comprise inputs from a BIER routing lookup table.

11. A method comprising:
    preloading to high at least one match line of a programming content addressable memory (CAM) comprising the at least one match line, the at least one match line being logically OR-ed for all selector lines;
    inverting the at least one match line to low upon a match result;
    activating a memory cell comprised in the at least one match line only when a stored data value and a corresponding selector line evaluate to 1; and
    performing a logical AND operation with the corresponding selector line and the stored data value.

12. The method according to claim 11 wherein the programming CAM is implemented as a Bit Indexed Explicit Replication (BIER) table.

13. The method according to claim 12 wherein data populating the BIER table comprises forwarding entries of a routing information base (RIB).

14. The method according to claim 11 wherein input data to the CAM comprises a bit mask in a header of an incoming packet.

15. The method according to claim 11 and further comprising partitioning a physical CAM multiple BIER tables by connecting the apparatus of claim 11 with a ternary CAM (T-CAM).

16. The method according to claim 15 wherein a bit mask is programmed in a packet in order to implement a match line for each neighbor.

17. The method according to claim 12 wherein the BIER table corresponds to a routing information base (RIB).

18. The method according to claim 11 wherein the CAM comprises:
    a plurality of AND gates, each AND gate of the plurality of AND gates having a first input comprising data pre-programmed into the CAM;
    a second input comprising an input from a selector line; and
    an output into an OR gate.

19. The method according to claim 11 wherein the CAM comprises:
    a plurality of OR gates, each OR gate of the plurality of OR gates having a first input comprising an output of an AND gate; and
    a second input from a second OR gate.

20. A apparatus comprising:
    means for preloading to high at least one match line of a programming content addressable memory (CAM) comprising the at least one match line, the at least one match line being logically OR-ed for all selector lines;
    means for inverting the at least one match line to low upon a match result;
    means for activating a memory cell comprised in the at least one match line only when a stored data value and a corresponding selector line evaluate to 1; and
    means for performing a logical AND operation with the corresponding selector line and the stored data value.

* * * * *